US007459984B2

(12) United States Patent
Wang et al.

(10) Patent No.: US 7,459,984 B2
(45) Date of Patent: Dec. 2, 2008

(54) METHOD AND APPARATUS FOR SELF-CALIBRATION AND ADAPTIVE TEMPERATURE COMPENSATION IN GPS RECEIVERS

(75) Inventors: Chi-Shin Wang, Half Moon Bay, CA (US); Kudrethaya A. Shridhara, Cupertino, CA (US); Jun Mo, San Jose, CA (US); Shaowei Han, Palo Alto, CA (US); Hansheng Wang, San Jose, CA (US)

(73) Assignee: Sirf Technology Holdings, Inc., San Jose, CA (US)

( * ) Notice: Subject to any disclaimer, the term of this patent is extended or adjusted under 35 U.S.C. 154(b) by 58 days.

(21) Appl. No.: 11/140,492

(22) Filed: May 26, 2005

(65) Prior Publication Data

US 2006/0267703 A1  Nov. 30, 2006

(51) Int. Cl.
*H03L 1/00* (2006.01)
*G01S 1/00* (2006.01)

(52) U.S. Cl. .............. 331/176; 331/158; 331/66; 342/357.06; 342/352; 342/357.13

(58) Field of Classification Search .......... 331/176, 331/66, 44, 116 R, 158, 175; 342/357.06, 342/357.08, 173, 174, 357.13, 352
See application file for complete search history.

(56) References Cited

U.S. PATENT DOCUMENTS

| 4,712,078 | A |   | 12/1987 | Slobodnik, Jr. et al. | ........ 331/99 |
| 5,594,453 | A |   | 1/1997 | Rodal et al. | ............. 342/357 |
| 5,629,708 | A |   | 5/1997 | Rodal et al. | ............. 342/357 |
| 5,644,271 | A |   | 7/1997 | Mollov et al. | ............ 331/176 |
| 5,654,718 | A | * | 8/1997 | Beason et al. | .......... 342/357.15 |
| 5,742,908 | A | * | 4/1998 | Dent | ........................ 455/517 |
| 5,765,101 | A |   | 6/1998 | Prockup | ................... 455/113 |
| 5,768,353 | A | * | 6/1998 | Browne | ................ 379/115.03 |

(Continued)

OTHER PUBLICATIONS

N. Scott Deno et al., "A Low Cost High Stability Microcontroller Compensated Crystal Oscillator," Proceedings, IEEE Frequency Control Symposium, May 1998, pp. 358-360.

(Continued)

*Primary Examiner*—Robert J. Pascal
*Assistant Examiner*—Ryan J. Johnson
(74) *Attorney, Agent, or Firm*—Orrick, Herrington & Sutcliffe LLP

(57) ABSTRACT

The invention provides a method and apparatus to optimally estimate and adaptively compensate the temperature-induced frequency drift of a crystal oscillator in a navigational signal receiver. A Read-Write memory encodes two tables, one for looking up frequency drift values versus temperature readings and another one for valid data confirmation on the first table. The initially empty look-up table is gradually populated with frequency drift values while the receiver computes the frequency drift along with its position. During initial start of the receiver or re-acquisition of satellite signals, the stored frequency drift value corresponding to the current temperature is used. If no valid frequency drift value is available, the frequency drift value is computed based on the existing frequency drift values in the table. This invention reduces the Time-To-First-Fix (TTFF) of the receiver and enables the receiver to self-calibrate, thus no additional factory calibration would be necessary.

22 Claims, 4 Drawing Sheets

U.S. PATENT DOCUMENTS

| | | | | |
|---|---|---|---|---|
| 5,781,073 | A | 7/1998 | Mii | 331/44 |
| 5,854,605 | A | 12/1998 | Gildea | 342/357 |
| 5,864,315 | A | 1/1999 | Welles, II et al. | 342/357 |
| 5,893,044 | A | 4/1999 | King et al. | 701/214 |
| 5,940,027 | A | 8/1999 | Forseth et al. | 342/357.06 |
| 5,949,372 | A | 9/1999 | Lennen | 342/357.02 |
| 6,067,503 | A | 5/2000 | Yakos | 701/213 |
| 6,078,224 | A | 6/2000 | Ujiie | 331/10 |
| 6,321,295 | B1 * | 11/2001 | Vincent | 711/117 |
| 6,384,774 | B1 | 5/2002 | Mutoh et al. | 342/357.06 |
| 6,448,925 | B1 | 9/2002 | Shridhara | 342/357.02 |
| 6,483,457 | B2 | 11/2002 | Hirata et al. | 342/357.12 |
| 6,509,870 | B1 | 1/2003 | Matsushita et al. | 342/357.15 |
| 6,522,212 | B1 | 2/2003 | Kodim | 331/176 |
| 6,662,107 | B2 | 12/2003 | Gronemeyer | |
| 6,674,402 | B2 | 1/2004 | Hirata et al. | 342/357.12 |
| 6,683,564 | B1 | 1/2004 | McBurney | 342/357.02 |
| 6,691,031 | B2 | 2/2004 | Lokshin et al. | 701/213 |
| 6,697,016 | B1 | 2/2004 | Voor et al. | 342/357.15 |
| 6,778,136 | B2 | 8/2004 | Gronemeyer | 342/357.15 |
| 6,864,800 | B2 | 3/2005 | Leichtfried et al. | 340/825.72 |
| 6,985,811 | B2 | 1/2006 | Gronemeyer | |
| 7,190,307 | B2 | 3/2007 | Gronemeyer | |
| 2002/0093452 | A1 | 7/2002 | Hirata et al. | 342/357.12 |
| 2002/0126039 | A1 * | 9/2002 | Dalton et al. | 342/26 |
| 2002/0167441 | A1 | 11/2002 | McBurney et al. | 342/357.03 |
| 2003/0030584 | A1 | 2/2003 | Hirata et al. | 342/357.12 |
| 2003/0068977 | A1 | 4/2003 | King | 455/12.1 |
| 2003/0083814 | A1 | 5/2003 | Gronemeyer | |
| 2003/0112179 | A1 | 6/2003 | Gronemeyer | 342/357.15 |
| 2003/0128157 | A1 | 7/2003 | Salkhi | 342/357.06 |
| 2003/0154025 | A1 * | 8/2003 | Fuchs et al. | 701/213 |
| 2003/0164795 | A1 | 9/2003 | McBurney | 342/357.06 |
| 2003/0176204 | A1 | 9/2003 | Abraham | 455/556.1 |
| 2003/0184399 | A1 * | 10/2003 | Lanoue et al. | 331/176 |
| 2003/0225514 | A1 | 12/2003 | Lokshin et al. | 701/213 |
| 2004/0220734 | A1 | 11/2004 | Gronemeyer | 701/214 |
| 2004/0225439 | A1 | 11/2004 | Gronemeyer | |
| 2005/0162306 | A1 | 7/2005 | Babitch et al. | |
| 2006/0047459 | A1 | 3/2006 | Underbrink et al. | |
| 2006/0195260 | A1 | 8/2006 | Gronemeyer | |

OTHER PUBLICATIONS

Raymond L. Filler, "Frequency-Temperature Considerations for Digital Temperature Compensation," 45th Annual Symposium on Frequency Control, 1991, pp. 398-404.

Raymond L. Filler, "Measurement and Analysis of Thermal Hysteresis in Resonators and TCXO's," 42nd Annual Frequency Control Symposium, 1988, pp. 380-387.

Dejan Habic, "The Design of a Microcontroller Temperature Compensated Crystal Oscillator and Automatic Compensation Line," IEEE Transactions on Ultrasonics, Ferroelectrics, and Frequency Control, vol. 42, No. 4, Jul. 1995, pp. 509-516.

T. Miyayama et al., "A New Digitally Temperature Compensated Crystal Oscillator for a Mobile Telephone System," 42nd Annual Frequency Control Symposium, 1988, pp. 327-333.

James A. Barnes et al., "Characterization of Frequency Stability," IEEE Transactions on Instrumentation and Measurement, vol. IM-20, No. 2, May 1971, pp. 105-120.

\* cited by examiner

METHOD AND APPARATUS FOR SELF-CALIBRATION AND ADAPTIVE TEMPERATURE COMPENSATION IN GPS RECEIVERS

BACKGROUND OF THE INVENTION

1. Field of the Invention

The present invention relates generally to navigational signal receivers and, more particularly, to an adaptive temperature compensation method and apparatus for estimating and compensating the temperature-induced frequency drifts of a local reference oscillator in a Global Positioning System (GPS) receiver.

2. Description of the Related Art

Satellite-based radio navigation systems have become widely adopted in many commercial and military applications. Exemplary systems in operation or development include the NAVigation Satellite Timing and Ranging Global Positioning System (NAVSTAR GPS), the Global'naya Navigatsionnaya Sputnikovaya Sistema (GLONASS), an European satellite navigation system called GALILEO, the wide area augmentation system (WAAS), and the local area augmentation system (LAAS). These systems permit a user with an appropriate direct sequence spread spectrum (DSSS) signal receiver to determine his or her position with respect to the Earth.

As an example, the GPS constellation has 24 operational satellites. These satellites are positioned in six different orbital planes such that at any time a minimum of six and a maximum of eleven satellites are visible to any user on the surface of the Earth, except in the polar region. The satellites operate in near circular 20,200 km (10,900 nm, or about 12,000 miles) orbits at an inclination angle of 55 degrees and with approximately a 12-hour period.

Each satellite contains at least one atomic clock and transmits an accurate time and position signal referenced to the atomic clock. A typical GPS receiver locks on to this signal and extracts the data contained therein. With signals from a sufficient number of satellites, a GPS receiver can calculate its position, velocity, altitude, and time.

The GPS satellites transmit data modulated signals at a nominal frequency of 1575.42 MHz. However, due to the velocity of the satellites and the user, this frequency may drift (increase or decrease) by 5 KHz or more. Thus, before locking onto a signal, the local oscillator in the receiver generally searches for available signals in a broad frequency range (i.e., 1575.42 MHz ±5 KHz or more). The broader the search range is, the longer the search time is, and so is the time-to-first-fix (TTFF) of the receiver.

Another important factor that affects the search range and time is the temperature-induced frequency drift of the local oscillator itself. As the local oscillator is exposed to temperature variations, its reference frequency may deviate from the designated value by several KHz. Each crystal used in the oscillator is unique, so the amount of drift also varies. The range of this temperature-induced frequency drift is therefore uncertain and varies from one oscillator to another and increases the search range, especially in the case of high sensitivity GPS receivers, since more frequency components are searched. Therefore, it is highly desirable to decrease this frequency uncertainty range to reduce the acquisition time of GPS signals.

Many efforts have been made to implement various techniques that compensate the crystal oscillator frequency drift due to temperature change. Generally, the temperature-induced frequency drift in the local oscillator frequency cannot be estimated without the help of a priori established look-up table. As such, most of the existing techniques require factory calibration. For example, the U.S. Pat. No. 5,781,073, issued to Mii and entitled, "TEMPERATURE COMPENSATION METHOD FOR AN OUTPUT FREQUENCY DRIFT OF AN OSCILLATOR" discloses a general purpose temperature compensation apparatus including a memory for storing a frequency compensation lookup table and characteristic factors derived from previous tests. These tests were conducted at factory and include a temperature acceleration test and a burn-in test.

According to Mii, during the temperature acceleration test, hundreds of oscillators are placed within a temperature chamber. As the temperature inside the chamber is slowly increased, corresponding output frequencies in response to the temperature variation are processed by a personal computer (PC) to create the frequency compensation lookup table, which is stored in the memory. The memory is likely a Read-Only memory, since the table is populated once with frequency drift values during the factory calibration process.

The U.S. Pat. No. 5,654,718, issued to Beason et al. and entitled, "GPS RECEIVER DEVICE AND METHOD FOR CALIBRATING A TEMPERATURE UNCOMPENSATED CRYSTAL OSCILLATOR" uses a Read-Only memory as well as a Read-Write memory. The CPU receives temperature information and recalls from the Read-Only memory the specified average crystal frequency drift at this known temperature. The frequency drift values had been previously determined and stored in the permanent Read-Only memory.

Another technique involves the use of polynomial of order higher than 3 in the estimation of the frequency drift as a function of temperature. The polynomial coefficients are pre-computed for each crystal and stored in a Read-Only memory. An example of this approach is disclosed in the U.S. Pat. No. 6,509,870, issued to Matsushita et al. and entitled, "SOFTWARE-COMPENSATED CRYSTAL OSCILLATOR" in which a $9^{th}$ degree polynomial is employed.

A problem with this approach is that the coefficients are different for each crystal. Thus, a lot of prior polynomial fitting is needed, which is time-consuming and can be expensive. Moreover, this approach is not applicable to temperature compensated crystal oscillators (TCXOs). The TCXOs sometimes exhibit reverse temperature characteristics. As such, an average value cannot be determined.

Clearly, there is a need in the art for a more flexible approach that enables adaptive compensation on the temperature-induced frequency drift of a local reference oscillator, that allows for the estimation of the frequency drift based on statistical methods under certain circumstances, and that allows a receiver to self-calibrate without any additional factory calibration or test set up, thus reducing the cost of the receiver. The present invention addresses this need.

BRIEF SUMMARY OF THE INVENTION

The present invention provides a new method and apparatus that can responsively and accurately estimate the temperature-induced local crystal oscillator frequency drift in a GPS receiver and accordingly and adaptively compensate the frequency drift in a timely manner. The invention achieves a fast initialization of the receiver with a relatively short Time-To-First-Fix (TTFF). Moreover, this invention is advantageously realized without any additional cost, factory calibration, and/or user calibration.

Briefly, a navigation-satellite receiver embodiment of the present invention comprises a crystal oscillator that is exposed to local ambient temperature and a non-volatile (Read-Write) memory encoding a look-up table. This look-up table is initialized to all zeros once, at the beginning of its lifetime. It is later gradually populated with frequency drift values as and when the receiver, and hence the crystal, is exposed to different temperatures.

The associated frequency drift values are determined as and when the receiver is computing its position at these temperatures. The current temperature of the crystal and the associated frequency drift is recorded in the look-up table. The frequency drift values entered into the table are averaged over same temperature readings, thus eliminating any noise present in the use of a single value.

During an initialization of the receiver, the receiver gets the ambient temperature of the crystal through a temperature sensor. This temperature sensor is placed very close to the crystal oscillator or integrated with the crystal for an accurate estimation of the temperature.

The receiver then retrieves the corresponding frequency drift from the look-up table. If there is no entry in the look-up table at this temperature, it is computed. This computation uses some statistical methods with minimum error criteria and is based on the current values in the look-up table. Meanwhile, a second look-up table maintains a list of temperature values where valid frequency drift values are available in the temperature versus frequency drift look-up table.

Any computed values that are higher or lower than predefined thresholds are discarded. When the computed values are discarded in this way, the frequency drift value is set to zero. This is a safeguard against using highly inaccurate drift values that may be computed in a large search range with small number of entries in the table.

This invention is applicable to oscillators that tend to show a reverse frequency drift versus temperature characteristics. The reverse characteristic means that the drift becomes more positive with an increase in temperature. This is the reverse of what is normally observed where the drift becomes more negative with an increase in temperature. Therefore, the present invention is advantageously applicable to oscillators employing uncompensated crystal oscillators (XO) as well as compensated crystal oscillators such as TCXO, when the drift performance of the latter is not acceptable.

Other objects and advantages of the present invention will become apparent to one skilled in the art upon reading and understanding the preferred embodiments described below with reference to the following drawings.

DETAILED DESCRIPTION OF THE PREFERRED EMBODIMENT(S)

Figure 1:
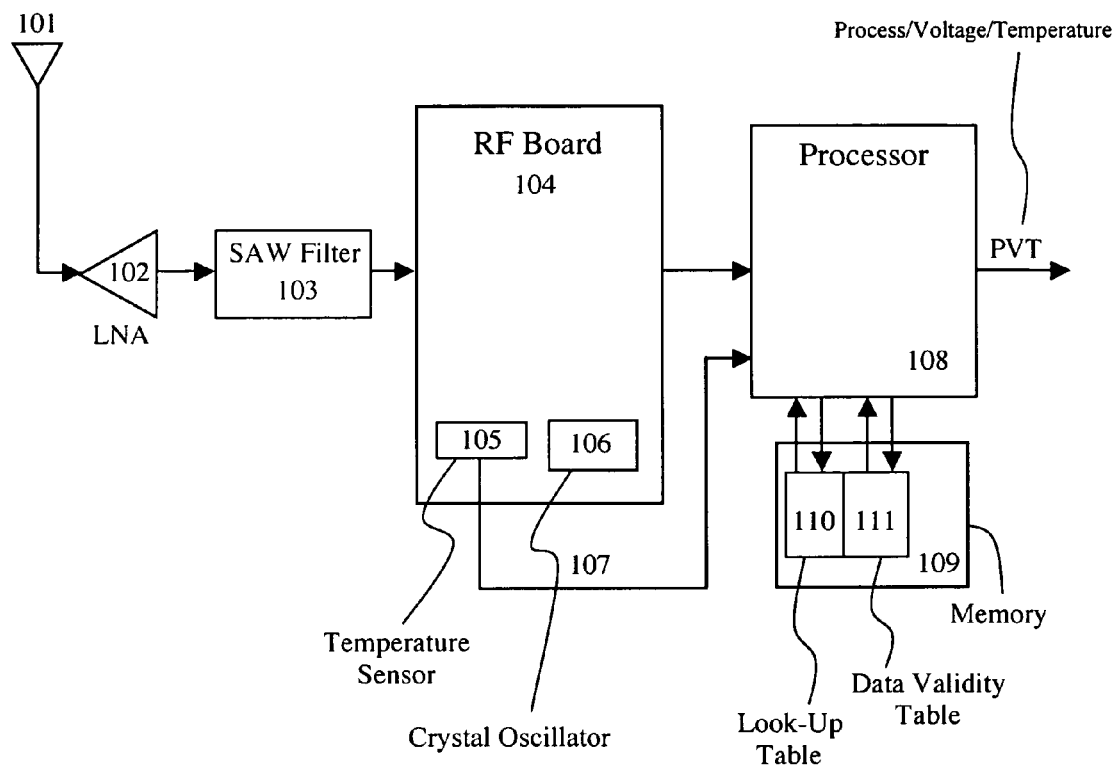
FIG. 1 is a functional block diagram of a navigational signal receiver embodying the present invention.

FIG. 1 illustrates an exemplary GPS receiver 100 implementing an embodiment of the present invention. The receiver 100 comprises a GPS antenna 101 for receiving signals from satellites at a nominal frequency of 1575.42 MHz.

During an initialization of the GPS receiver, the received signals from the satellites are filtered and amplified so that the signal amplitude and carrier frequency has an acceptable value. In this example, the received signal is amplified by a Low Noise Amplifier (LNA) 102. The antenna 101 may be active, in which case an LNA is integrated therewith. Alternatively, the antenna 101 may be passive, in which case there is no integrated amplifier.

The signal output from the LNA is filtered using a Surface Acoustic Wave band-pass (SAW) filter 103. The filter 103 removes any noise in the frequency band which is outside of the GPS band.

The signal then enters the Radio Frequency (RF) section 104, which contains many amplification, signal multiplication or mixing, and filtering stages. The RF section 104 also houses a local reference crystal oscillator 106 that provides the clock to all parts of the receiver when powered up. It is required to compensate the frequency of this oscillator 106. In this example, the oscillator 106 is a temperature compensated crystal oscillator (TCXO).

A temperature sensor 105 is placed very close, in proximity to the oscillator 106. Alternatively, the temperature sensor 105 may be integrated with the oscillator 106. The temperature measured by the temperature sensor 105 indicates the near actual temperature of the oscillator 106.

The filtered and amplified GPS signal is further processed in a processor 108. The processor 108 is connected to many peripherals such as keyboard, display, different types of memories, etc. These peripherals are not shown here as they are not required to understand the present invention. The processor 108 is also connected to a Read-Write (R/W) memory 109 that contains, apart from other data, two look-up tables 110-111.

The table 110 is configured for storing actual frequency drift values for different ambient crystal temperatures. Only one value of drift exists for a given temperature in the table 110. This value may be the average of several values computed or otherwise obtained during the process of writing to the table 110.

The table 111 is configured for confirming valid data in the table 110, i.e., it will have a non-zero entry whenever a valid frequency drift value is put in the table 110. In some embodiments, the table 111 contains some indices to indicate that valid drift values are present in the table 110. For example, the index may be 0 for indicating no valid drift value in the corresponding entry in the table 110 and a non-zero entry for indicating a valid drift value. The processor 108 consults the indices in the table 111 to decide whether to retrieve the value from the table 110 or to compute it.

The computed oscillator frequency drifts are entered into the table 110 and stored in the memory 109 by the processor 108. This writing/storing process is possible when the processor 108 is able to compute the position during which the frequency drift is also computed.

The temperature sensor 105 is connected to the processor 108 by a wired connection. However, any suitable inter-chip connections may be utilized.

The receiver may start in the cold start or hot start mode. In the cold start mode, the receiver will have no input information regarding the current position and time. In the absence of these parameters, it starts searching for more satellites than necessary without any information on the satellite positions.

On the other hand, when the receiver is initialized with information on time and position, as in the hot start mode, it can compute the list of the visible satellites and their position using what is known as almanacs or its more precise counterpart ephemeris. These almanacs/ephemeris provide the position and other information on satellites and stored in the memory of the receiver. There are some other initialization modes such as the warm start mode, which depends on some partial input information.

All these initialization methods require the compensation of the local oscillator frequency drift to reduce the frequency search range and hence to have a faster lock onto the satellite signals. As such, upon initialization, the ambient temperature of the crystal oscillator is measured and sent to the processor 108 through a wired connection 107.

The processor 108 retrieves from the look-up table 110 the frequency drift data that corresponds to this temperature. If a valid frequency drift data is already present in the look-up table 110, the processor 108 compensates the local oscillator frequency drift with that value. The validity of this data is confirmed by the other look-up table 111.

If there are no valid data in the entire look-up table 110, a zero frequency drift is assumed. In addition, if there is only one data value present in the entire look-up table 110, a zero drift is assumed. Alternatively, the value itself may be used as the required drift.

When the look-up table 110 has more than one valid drift values, two scenarios are possible and the frequency drift is computed using different approaches. Below discusses these scenarios.

In the first scenarios, there may be valid frequency drift values at temperature values on both sides (higher and lower) of the present temperature value. In that case, the frequency drift is computed by interpolating the two immediate valid data points on both sides of the present temperature. Only the two immediate values, one on each side, are used in this interpolation. The range for the validity of this computation is the entire range of the look-up table 110. This results in a fairly good approximation of the frequency drift value with a negligible increase in the computational load as this can be accomplished with one line of C code.

In the other possible scenario, the valid frequency drift data is available on only one side of the current measured temperature. This means that the valid drift data values are all correspond to either higher temperature or lower temperature values of the current measured temperature. In such cases, an extrapolation technique with minimum error criteria is used. The extrapolation makes use of all the valid drift values in the look-up table 110.

Figure 2:
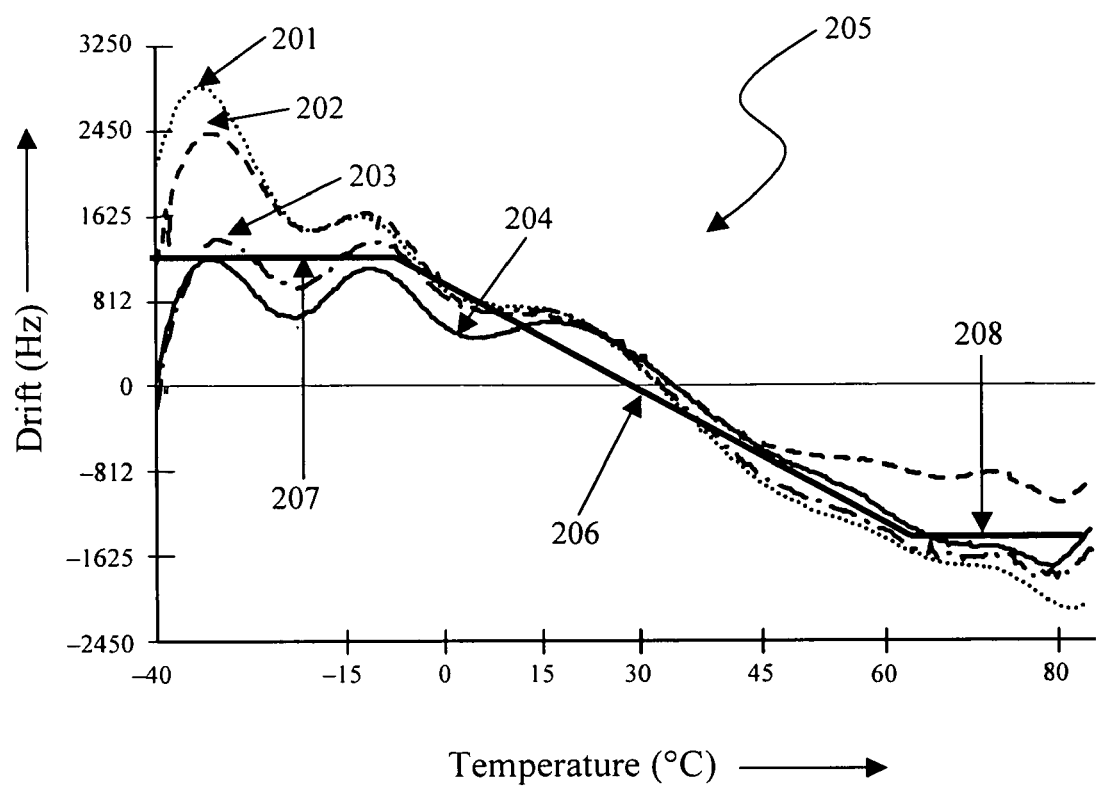
FIG. 2 plots temperature versus frequency drift for four different temperature compensated crystal oscillators (TCXOs).

FIG. 2 illustrates the nature of the temperature-induced frequency drift variation amongst different types of crystals used in oscillators. The four curves 201, 202, 203, and 204 represent four different TCXOs used to implement the exemplary embodiment shown in FIG. 1. The horizontal or x-axis represents the ambient temperature of the crystal, ranging from −40° C. to +85° C. The vertical or the y-axis represents the corresponding frequency drift in Hertz.

According to FIG. 2, all of the curves 201, 202, 203, and 204 may be approximated to a form shown as the shape 205. Further, the shape 205 may be divided into three sections: 206, 207, and 208. The section 206 is in the temperature range of −2.5° C. to 60° C. The section 207 is in the temperature range of −40° C. to −2.5° C. The section 208 is in the temperature range of +60° C. to +85° C. It is evident from the shape 205 that the curves 201, 202, 203, and 204 may be approximated by a straight line 206 in the temperature range of −2.5° C. to 60° C., and by two horizontal lines 207 and 208 outside this temperature range. Note that these temperature ranges are approximation and need not be strictly adhered thereto.

Figure 3:
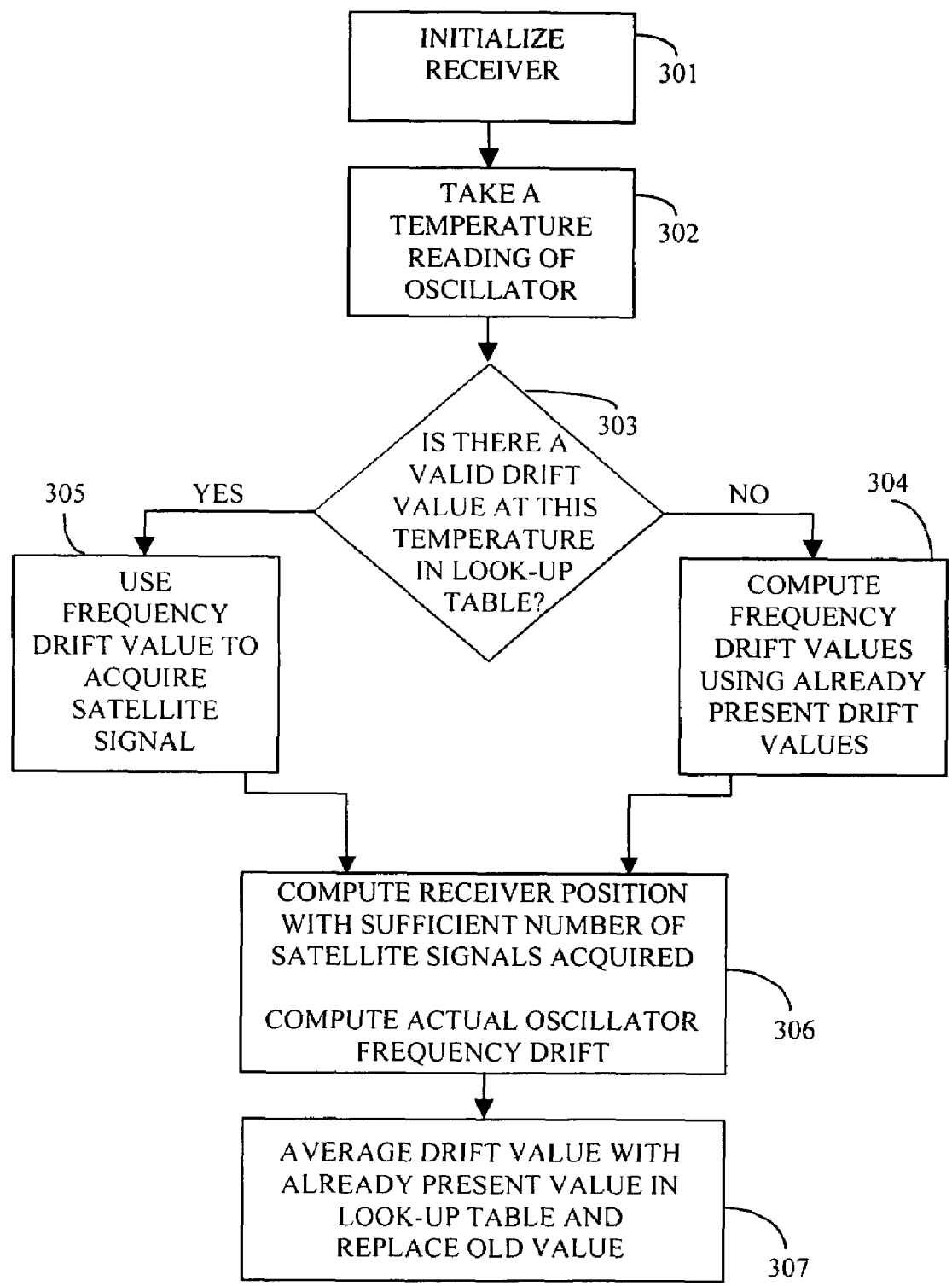
FIG. 3 is a flowchart representing a preferred embodiment of the frequency drift compensation process according to the present invention.

FIG. 3 illustrates the frequency drift compensation procedure. In step 301, the receiver is powered up or initialized, upon which it starts to search for visible satellites. Prior to this, the temperature sensor measures the ambient temperature of the crystal of the reference oscillator placed in the RF board, as shown in step 302. Later, in step 303, the processor looks for an available frequency drift value in the look-up table for this temperature value, as discussed above with reference to FIG. 1.

When the look-up table has a valid frequency drift value, as shown in step 305, the processor continues to acquire GPS satellite signals. When there is no valid drift value in the table corresponding to the current temperature, the processor computes the frequency drift value using the already available drift values in the look-up table. This computation procedure is further discussed in detail with reference to FIG. 4.

After the frequency drift value has been estimated in this way, the processor continues to acquire the satellite signals and eventually locks onto those signals. When enough satellite signals are locked, the processor computes the position. The satellite-based positioning computation is generally known in the art.

In addition to computing the position, the processor computes the value of the frequency drift associated with the crystal in step 306. The computed frequency drift is averaged with the already present drift value for the current temperature. If there is no valid drift value in the look-up table or if the existing value in the table is different from the current value by a significantly large amount, say, more than 100 Hz, the current value is stored without averaging. This is illustrated in step 307.

Figure 4:
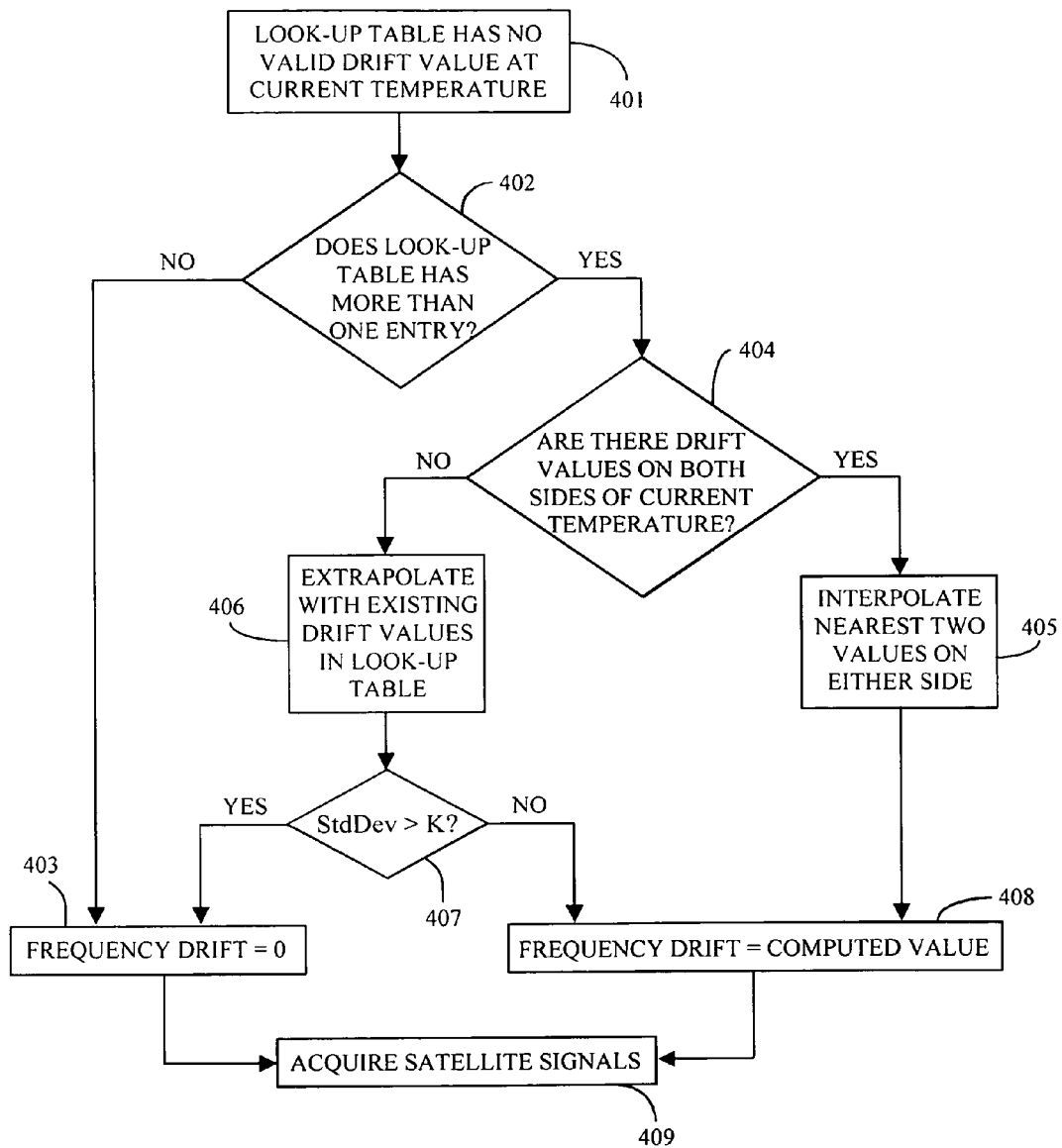
FIG. 4 is a flowchart representing a preferred embodiment of the temperature-induced frequency drift computation process according to the present invention.

FIG. 4 illustrates the flow of the frequency drift computation process. This applies when there are no valid frequency drift values available in the look-up table (e.g., the table 110 of FIG. 1) at the current measured temperature. If this look-up table has one or no valid drift values present, as given in step 402, the frequency drift is assumed to be zero and no compensation is used, as shown in step 403. When more than one valid frequency drift values are present in the look-up table, a decision is made, as shown in step 404. If more than two valid frequency drift values are present in the look-up table, the required frequency drift value is computed either by interpolation or extrapolation. If valid drift values are present at a temperature higher than the current temperature and also at a temperature lower than the current temperature, an interpolation of the nearest two values on both sides gives the computed value of the frequency drift. This is illustrated in step 405.

On the other hand, if the valid drift values in the look-up table are all correspond to temperature readings that are either higher or lower than the present temperature, an extrapolation is used, as represented by the logic block 406. This extrapolation makes use of all the valid frequency drift values already present in the look-up table. In an embodiment, a linear extrapolation is made using minimum mean square error criteria. This approximation need not be restricted to linear approximation. Other minimum error techniques with non-linear approximations may also be used.

When extrapolation is made, the computed value may be erroneous because the present values in the look-up table may not be optimally arranged. So, the extrapolated value is used only if the error in computation is sufficiently small, within an acceptable limit. Statistical parameters are computed and used to determine the estimation error and validate the extrapolated drift value. One of the possible statistical parameters is Standard Deviation (StdDev), which indicates the width over which the individual values are spaced apart. The logic block 407 shows how a decision is made using a StdDev of K as a limiting value. As indicated in step 403, a frequency drift of zero is used when the Standard Deviation or estimation error is too large, i.e., exceeds the limiting value. If the expected error is within the limit, the computed frequency drift is used in the acquisition of the satellite signals, as shown in the logic block 409.

In some embodiments, a navigational satellite signal receiver capable of computing a local crystal oscillator frequency drift comprises:

a GPS receiver platform which is able to acquire, lock, and track a plurality of signals from GPS transmitters and to generate navigational solutions under appropriate conditions;

a local reference crystal oscillator, the frequency of which drifts from the nominal value when the ambient temperature of the oscillator changes;

a temperature sensor for measuring the current temperature of the oscillator and transmitting the temperature measurement to the appropriate destination;

a Read-Write memory device, the contents of which is initialized to zero, for storing the frequency drift values for all of the temperature steps of interest; and a processor connected to the memory and, when supplied with the ambient temperature of the oscillator, able to retrieve the frequency drift values from the memory and, when no frequency drift value is available in the memory, to compute the oscillator frequency drift using the drift values already available for other temperatures in the memory.

The processor is also capable of searching for signals from the GPS transmitters in both time and frequency space. A software-based compensation based on statistical methods is employed in the search. Upon successful locking onto a required number (e.g., three or more) of GPS signals, the receiver is said to be initialized. The processor then computes a navigation solution. This navigation solution includes an adaptive compensation of the crystal oscillator frequency drift at the current temperature, as discussed above. The computed frequency drift for the current temperature is averaged with the already present frequency drift values in the corresponding memory area. The memory area indicates the current temperature. This averaging may be abandoned upon discovering a higher than a predefined difference between computed frequency drift and the stored frequency drift in the memory, all indicating the same temperature step. Under this later condition, only computed frequency drift value is stored in the memory area.

According to the invention, the method for a software-based adaptive compensation of a crystal oscillator frequency drift comprises the steps of:

measuring the ambient temperature of the crystal oscillator with a temperature sensor, which is placed in the proximity of or within the crystal oscillator;

assigning a second memory means to validate the frequency drift values stored in a first memory means;

retrieving, during the receiver initialization stage, the frequency drift corresponding to the measured temperature from the first memory means;

if the first memory means has no valid frequency drift value as indicated by the second memory means, computing the frequency drift; and if the first memory means has a valid frequency drift value, compensating the local crystal oscillator frequency with the retrieved frequency deviation. Otherwise, use the computed frequency deviation value for the compensation. The frequency drift compensation is the process of increasing or decreasing the local oscillator frequency by a known quantity.

In computing the frequency drift upon no valid frequency drift data is available, a value of zero is the computed frequency drift. If there is a single valid frequency drift value, the single value itself or a zero value is the frequency drift value for the current temperature. As discussed above, if there are a plurality of valid frequency drift values that correspond to temperature readings that are both higher and lower than the current measured temperature value, an averaging method known in the art as interpolation is utilized to compute the required frequency drift value. If there are a plurality of valid frequency drift values that correspond to temperature readings that are all higher or all lower than the current measured temperature value, an extrapolation method with minimum error criteria is utilized to compute the frequency drift for the current temperature value.

When some other additional statistical parameters indicate that the computed frequency drift value is not reliable, it is discarded and, instead, a zero value is used for the frequency drift. These statistical parameters are computed using the already present valid frequency drift values in the memory.

The dependency of the temperature-induced frequency deviation may assume a linear form over a specified range of temperature values. This linearity is present above and below the temperature value known in the art as the inflection point. The variation may assume a constant value on both sides, beyond the linear range.

Alternatively, the dependency of the temperature-induced frequency deviation may be in a non-linear form starting at the high and low temperature values of the linear range. In the non-linear form, the frequency drift versus temperature variation is represented by polynomials of order two or higher. The non-linear variation is used for all temperature values where the linear relationship does not exist.

A GPS receiver implementing the present invention may be using a plurality of temperature compensation mechanisms. In the simplest embodiment of the invention, the receiver implements the software-based adaptive compensation method disclosed herein and no other temperature compensation mechanism is used.

As one skilled in the art will appreciate, to the extent that a navigational signal receiver is programmed to perform particular functions pursuant to computer-executable instructions that implement the present invention, it becomes a receiver within the scope and spirit of the present invention. The necessary programming-related techniques are well known to those skilled in the art and thus are not further described herein for the sake of brevity.

The computer-executable instructions implementing the present invention include, among others, code for causing a processor to generate an estimated frequency drift due to temperature variation, code for discarding unreliable frequency drift estimates, and code for storing optimum frequency drift values indicative of the corresponding temperature value into a memory area. These computer-executable instructions can be distributed on a computer-readable medium such as floppy disk, memory module, or CD-ROM and are often copied onto a hard disk or other storage medium. Such computer program execution and distribution operations are well known to those skilled in the art and thus are not further described herein. The term "computer-readable medium" encompasses distribution media, intermediate storage media, execution memory of a computer, and any other medium or device capable of storing for later reading by a computer a computer program implementing the invention disclosed herein.

Although the present invention has been described in terms of the presently preferred embodiments, it is to be understood that the disclosure is not to be interpreted as limiting. As one of ordinary skill in the art will appreciate, various changes, substitutions, and alterations could be made or otherwise implemented without departing from the spirit of the present invention. Accordingly, the scope of the present invention should be determined by the following claims and their legal equivalents.

We claim:

1. A method of compensating an oscillator frequency drift, comprising:
    encoding a memory device with a first look-up table;
    determining a frequency drift value associated with a temperature reading of said oscillator;
    incrementally populating said first look-up table with said frequency drift values as said oscillator is exposed to temperature changes;
    acquiring satellite signals;
    computing a frequency drift value at a current temperature after the receiver has acquired the satellite signals;
    when a frequency drift value is presently stored in the first look-up table at the current temperature, averaging the computed frequency drift value with the presently stored frequency drift value in said first look-up table to obtain an average frequency drift value;
    replacing the presently stored frequency drift value in said first look-up table with the average frequency drift value; and
    encoding said memory device with a second look-up table comprising indices that indicate which entries in the first look-up table have valid frequency drift values.

2. The method according to claim 1, further comprising:
    initializing said first look-up table to all zeros once, at its very first use.

3. The method according to claim 1, further comprising:
    positioning a temperature sensor in proximity of or within said oscillator.

4. The method according to claim 1, further comprising:
    retrieving from said first look-up table a frequency drift value that corresponds to a temperature reading.

5. The method according to claim 1, further comprising:
    discarding one or more frequency drift values that are higher or lower than predefined threshold values.

6. The method of claim 1, further comprising:
    determining whether the computed frequency drift value differs from the already present frequency drift value in the first look-up table by a predetermined amount; and
    when the computed frequency drift value differs from the already present frequency drift value by at least the predetermined amount, replacing the already present frequency drift value in the first look-up table with the computed frequency drift value at the current temperature.

7. The method according to claim 1, wherein said first look-up table contains at least two valid frequency drift values, comprising:
    determining whether said at least two valid frequency drift values include a first one that is at a higher temperature than a current temperature reading and a second one that is at a lower temperature than said current temperature reading.

8. The method according to claim 1, wherein said first look-up table contains at least two valid frequency drift values, comprising:
    interpolating or extrapolating said at least two valid frequency drift values.

9. The method according to claim 8, further comprising:
    utilizing a linear or non-linear approximation technique with minimum error criteria.

10. The method according to claim 1, wherein said first look-up table contains a single valid frequency drift value, further comprising:
    utilizing zero, said single valid frequency drift value, or a previously stored value in said compensating step.

11. The method according to claim 1, wherein said first look-up table contains no valid frequency drift values, further comprising:
    utilizing zero or a previously stored value in said compensating step.

12. A navigational satellite signal receiver implementing the method steps of claim 1, said oscillator residing in said navigational satellite signal receiver.

13. A computer-readable medium storing computer-executable program instructions implementing the method steps of claim 1.

14. A method of compensating an oscillator frequency drift, comprising:
    encoding a memory device with a first look-up table;
    determining a frequency drift value associated with a temperature reading of said oscillator;
    incrementally populating said first look-up table with said frequency drift values as said oscillator is exposed to temperature changes;
    acquiring satellite signals;
    computing a frequency drift value at a current temperature after the receiver has acquired the satellite signals;
    when a frequency drift value is presently stored in the first look-up table at the current temperature, averaging the computed frequency drift value with the presently stored frequency drift value in said first look-up table to obtain an average frequency drift value;
    replacing the presently stored frequency drift value in said first look-up table with the average frequency drift value; and
    validating said frequency drift values before storing in said first look-up table.

15. A navigational satellite signal receiver, comprising:
    a local reference oscillator;
    a temperature sensor in proximity or within said oscillator for obtaining temperature readings on said oscillator;
    a processor coupled to said temperature sensor, said processor capable of processing navigational satellite signals; and
    a memory device coupled to said processor and encoded with a first look-up table for storing frequency drift values associated with said temperature readings of said oscillator; wherein
    said first look-up table incrementally populated with said frequency drift values as said oscillator is exposed to temperature changes; wherein
    said processor utilizes said first look-up table to adaptively compensate said temperature changes; and wherein
    said processor computes a frequency drift value at a current temperature after the receiver has acquired satellites signals; wherein when a frequency drift value is presently stored in the first look-up table at the current temperature, said processor averages the computed frequency drift value at the current temperature with the presently stored frequency drift value at the current temperature to obtain an average frequency drift value and replaces the presently stored drift value in the first look-up table with the average frequency drift value at the current temperature; and wherein said memory device is encoded with a second look-up table for confirming that valid frequency drift values are stored in said first look-up table.

16. The navigational satellite signal receiver of claim 15, wherein said oscillator comprising temperature uncompensated crystals.

17. The navigational satellite signal receiver of claim 15, wherein said oscillator comprising temperature compensated crystals.

18. A computer-readable medium storing computer-executable program instructions, comprising:

code for encoding a memory device with a first look-up table;

code for determining a frequency drift value associated with a temperature reading of said oscillator;

code for incrementally populating said first look-up table with said frequency drift values as said oscillator is exposed to temperature changes;

code for adaptively compensating said temperature changes utilizing said first look-up table; code for initializing said first look-up table to all zeros;

code for averaging frequency drift values associated with same temperature reading;

code for retrieving from said first look-up table a frequency drift value that correspond to a temperature reading;

code for discarding one or more frequency drift values that are higher or lower than predefined threshold values;

code for validating said frequency drift values before storing in said first look-up table;

code for encoding said memory device with a second look-up table encoding said memory device with a second look-up table comprising indices that indicate which entries in the first look-up table have valid frequency drift values; and code for determining whether there are at least two valid frequency drift values and correspondingly interpolating or extrapolating said at least two valid frequency drift values.

19. A method of compensating an oscillator frequency drift, comprising:

encoding a memory device with a first look-up table;

determining a frequency drift value associated with a temperature reading of said oscillator;

incrementally populating said first look-up table with said frequency drift values as said oscillator is exposed to temperature changes;

adaptively compensating said temperature changes utilizing said first look-up table;

acquiring satellite signals;

computing a frequency drift value at a current temperature after a receiver has acquired satellite signals; wherein when the first look-up table contains a single valid frequency drift value and the current temperature does not correspond to the single valid frequency drift value, further comprising:

utilizing a zero frequency drift value in the compensating step.

20. A method of compensating an oscillator frequency drift, comprising:

encoding a memory device with a first look-up table;

determining a frequency drift value associated with a temperature reading of said oscillator;

incrementally populating said first look-up table with said frequency drift values as said oscillator is exposed to temperature changes;

adaptively compensating said temperature changes utilizing said first look-up table;

acquiring satellite signals;

computing a frequency drift value at a current temperature after a receiver has acquired satellite signals; wherein the oscillator is a temperature compensated oscillator and when the current temperature is above a predetermined temperature, further comprising:

assuming that the frequency drift is at a constant value above the predetermined temperature; and utilizing the constant value in the compensating step.

21. A method of compensating an oscillator frequency drift, comprising:

encoding a memory device with a first look-up table;

determining a frequency drift value associated with a temperature reading of said oscillator;

incrementally populating said first look-up table with said frequency drift values as said oscillator is exposed to temperature changes;

adaptively compensating said temperature changes utilizing said first look-up table;

acquiring satellite signals;

computing a frequency drift value at a current temperature after a receiver has acquired satellite signals; wherein the oscillator is a temperature compensated oscillator and when the current temperature is below a predetermined temperature, further comprising:

assuming that the frequency drift is at a constant value below the predetermined temperature; and utilizing the constant value in the compensating step.

22. A method of compensating an oscillator frequency drift, comprising:

encoding a memory device with a first look-up table;

determining a frequency drift value associated with a temperature reading of said oscillator;

incrementally populating said first look-up table with said frequency drift values as said oscillator is exposed to temperature changes;

adaptively compensating said temperature changes utilizing said first look-up table;

acquiring satellite signals;

computing a frequency drift value at a current temperature after a receiver has acquired satellite signals; wherein when the first look-up table does not contain a valid frequency drift value at the current temperature, further comprising:

extrapolating the frequency drift value at the current temperature using frequency drift values stored in the first look-up table;

determining an error of the extrapolation;

if the error is below a predetermined value, utilizing the extrapolated frequency drift value in the compensating step; and if the error is above the predetermined value, utilizing a zero frequency drift value in the compensating step.

* * * * *